United States Patent [19]
Fodali

[11] Patent Number: 4,978,312
[45] Date of Patent: Dec. 18, 1990

[54] TIP ATTACHMENT FOR CIRCUIT PROBE TESTER

[75] Inventor: Adolph Fodali, Lake Hiawatha, N.J.

[73] Assignee: S & G Tool Aid Corp., Newark, N.J.

[21] Appl. No.: 414,586

[22] Filed: Oct. 24, 1989

Related U.S. Application Data

[63] Continuation of Ser. No. 197,659, May 23, 1988, abandoned.

[51] Int. Cl.⁵ .................................................. H01R 11/18
[52] U.S. Cl. .................................... 439/219; 324/158 P; 324/72.5; 439/482; 439/841; 439/909
[58] Field of Search ............... 439/169, 219, 482, 840, 439/841, 909; 324/158 P, 72.5, 650 P, 149

[56] References Cited

U.S. PATENT DOCUMENTS

| | | | |
|---|---|---|---|
| 2,581,116 | 1/1952 | Lewis | 439/482 |
| 3,058,083 | 10/1962 | Schneider | 439/841 |
| 3,676,776 | 7/1972 | Bauer et al. | 324/158 P |
| 3,885,848 | 5/1975 | Brouneus | 439/841 |
| 4,000,745 | 1/1977 | Goldberg | 439/909 |
| 4,178,058 | 12/1979 | Swenson | 439/482 |
| 4,620,763 | 11/1986 | Mochida | 439/841 |
| 4,632,496 | 12/1986 | Williams | 439/841 |
| 4,716,365 | 12/1987 | Pool | 439/482 |
| 4,740,746 | 4/1988 | Pollock et al. | 324/72.5 |

*Primary Examiner*—P. Austin Bradley
*Attorney, Agent, or Firm*—James & Franklin

[57] ABSTRACT

The attachment consists of a single length of resilient wire formed into a coil spring portion, a probe engaging portion and an elongated tip portion. The tip portion extends forwardly from the coil spring portion in a direction generally parallel to the probe and has a uniform cross-sectional dimension throughout its length. A radially extending portion of the wire is bent to form a recess adapted to engage the insulated wire of the probe, so as to retain the attachment when not in use.

20 Claims, 2 Drawing Sheets

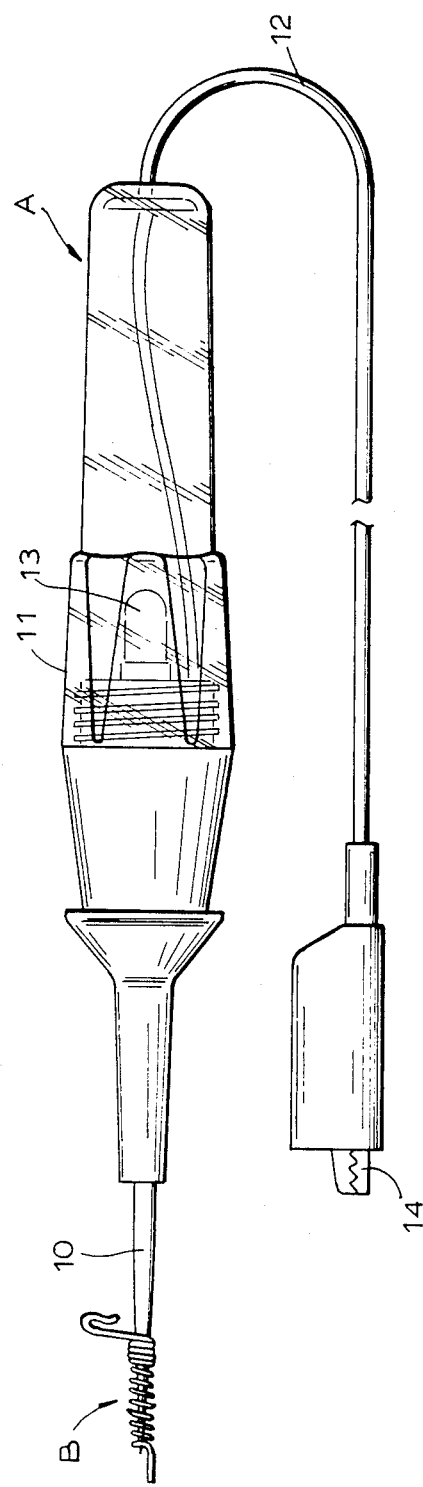
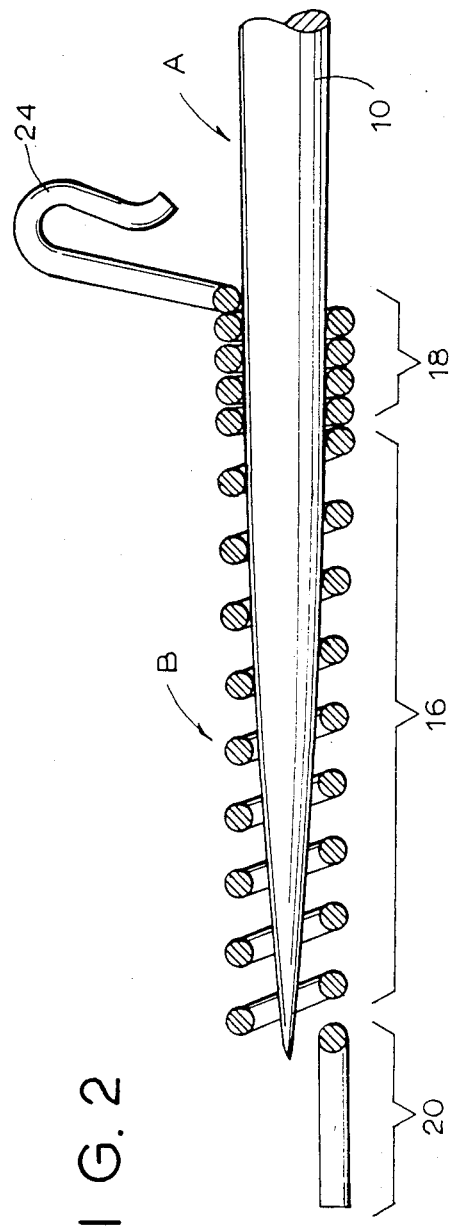

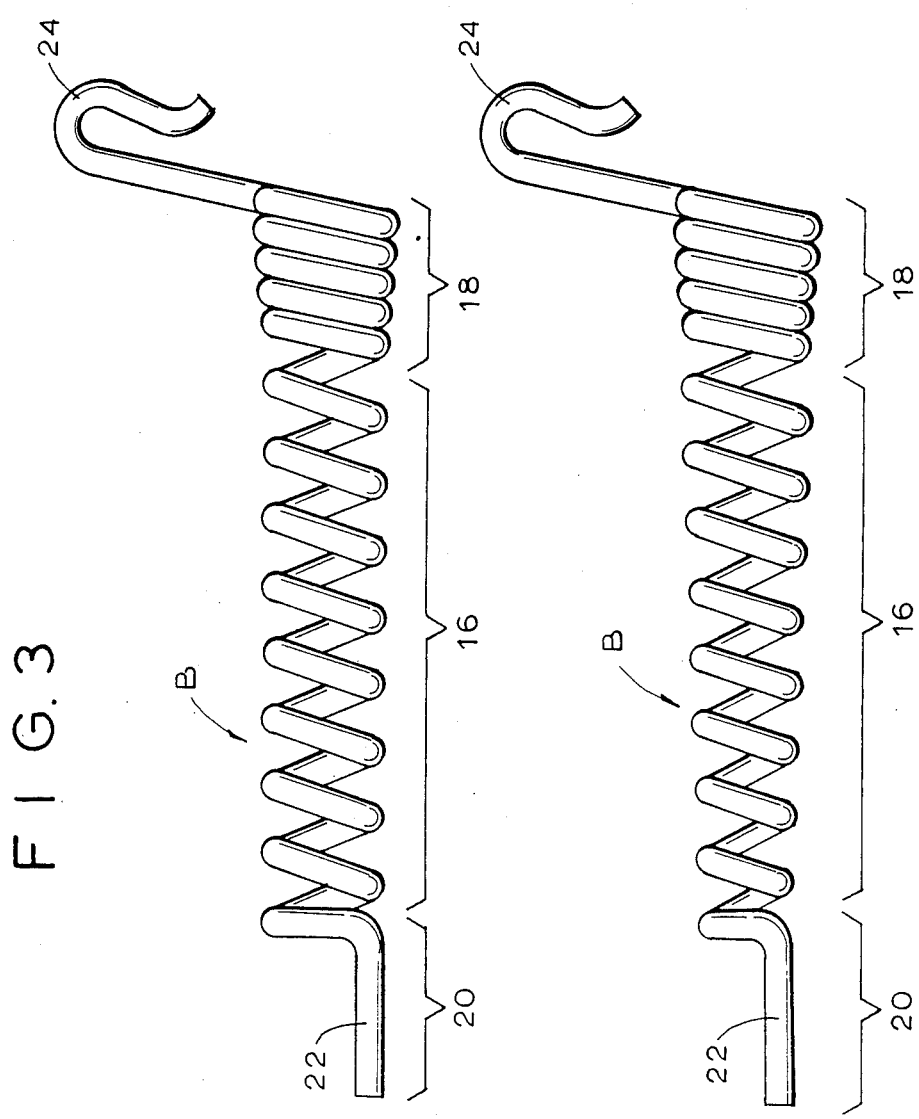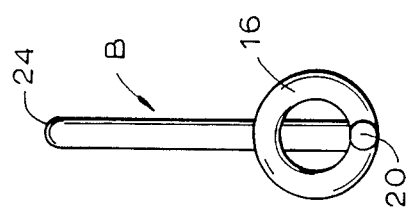

TIP ATTACHMENT FOR CIRCUIT PROBE TESTER

This is a continuation of co-pending application Ser. No. 197,659 filed on May 23, 1988, abandoned.

The present invention relates to electrical circuit continuity test probes and more particularly to a tip attachment adapted for use with such probes to prevent damage to connector terminals being tested resulting from the insertion of the probe tip.

Hand held electrical circuit tester devices are used to test the continuity of electrical terminals, such as the wire harness coverter terminals in automobile engines or the like. Such testers are often of the ice pick type, that is, include an insulated handle portion with an ice pick type probe entending therefrom. An insulated ground wire, with an aligator clip or the like, extends from the rear of the handle portion. The aligator clip is grounded, by connecting to the chasis or the like, before the probe tip is inserted into the terminal. A visible continuity test lamp, contained in the tester handle, is energized when the proper continuity is detected.

The tip of the probe is normally made of a rigid, electrically conductive material, such as metal. It is generally conically shaped, with the cross-sectional dimension of the probe tapering rapidly to a sharp point proximate the tip.

Since the probe is made of rigid material and has a tapered tip. If the tip is inserted too deeply or at an inappropriate angle between the terminals, the terminals may be bent or damaged. The present invention eliminates the problem of damaged or deformed connector terminals by providing an attachment for mounting on the probe tip which is thin and flexible, and has a tip portion which has a substantially uniform cross-section. The attachment can be manufactured relatively inexpensively and is adapted to fit a variety of different pick type circuit testers.

It is, therefore, a prime object of the present invention to provide a tip attachment for a circuit tester probe which will prevent the damage or deformation of connector terminals under test.

It is another object of the present invention to provide a tip attachment for a circuit tester probe which is inexpensive to manufacture and adapted to fit a variety of different probes.

It is another object of the present invention to provide a tip attachment for a circuit tester probe which may be manufactured from a single length of resilient wire.

It is another object of the present invention to provide a tip attachment for a circuit tester probe which includes a resilient coil spring portion.

It is another object of the present invention to provide an attachment for a circuit tester probe which includes a probe engaging portion formed of a coil spring.

It is another object of the present invention to provide a tip attachment for a circuit tester probe which includes an elongated tip portion with a substantially uniform cross-section.

It is another object of the present invention to provide a tip attachment for a circuit tester probe which includes a radially extending portion of wire bent to form a recess for engaging the insulated ground wire of the tester.

In accordance with the present invention, an attachment adapted for use with a pick-type circuit tester probe is provided. The attachment includes resilient means, means for mounting the resilient means on the probe and tip means extending outwardly from the resilient means. The tip means has an elongated body.

The tip means preferably has a substantially uniform cross-section dimension throughout its useful length and extends in a direction generally parallel to the probe.

The attachment is designed for use with a circuit tester which includes an insulated ground wire. The attachment further comprises means for attaching the attachment to the insulated ground wire.

The resilient means comprises spring means. The spring means comprises a coil spring part with spaced turns. The spring means is preferably composed of music wire. The mounting means comprises means for frictionally engaging the probe. The engaging means comprises coil spring means in the form of a coil spring part with tapered turns. The coil spring part is preferably also composed of music wire.

The body has a rounded forward end. It is preferably composed of resilient material, such as music wire.

The attaching means comprises ground wire engaging means in the form of spring means. The spring means comprises a resilient wire section bent to form a recess within which the ground wire is frictionally engaged. The recess is radially spaced from the mounting means.

In accordance with anotheer aspect of the present invention, an attachment is provided which is adapted for use with a pick-up circuit tester probe. The attachment includes a length of resilient wire formed into a coil spring portion, a probe engaging portion and an elongated tip portion. The tip portion extends outwardly from the coil spring portion in a direction generally parallel to the probe and has a substantially uniform cross-section dimension through its useful length.

The attachment is adapted for use with a circuit tester which includes an insulated ground wire. The length of wire further includes a radially extending portion which forms a ground wire engaging recess.

The forward end of the tip of the attachment is preferably rounded.

To these and such other objects which may hereinafter appear the present invention relates to a tip attachment for use with a circuit tester probe as described in the following specification and recited in the annexed claims taken together with the accompanying drawings wherein like numerals refer to like parts and in which:

FIG. 1 is a side view of a conventional pick-type electrical circuit continuity tester and the tip attachment of the present invention;

FIG. 2 is an enlarged cross-sectional view showing the tip of the tester illustrated in FIG. 1 and the tip attachment of the present invention;

FIG. 3 is a side view of a first preferred embodiment of the tip attachment of the present invention;

FIG. 4 is a side view of a second preferred embodiment of the tip attachment of the present invention; and FIG. 5 is a front view of the tip attachment of the present invention.

As shown in the drawings, a conventional pick-type electrical circuit continuity tester includes an insulated handle portion, generally designated A, with a pick-type probe portion 10 extending therefrom. Handle portion A has an insulated ground wire 12 extending from the rear portion thereof, which may terminate in an insulated aligator clip 14. The probe portion 10 is composed of electrically conducting rigid material, such as metal. It has a round cross-section and tapers rapidly to a sharp point at the forward end thereof as best seen in FIG. 2. Handle portion A is preferably made of plastic or the like and has a transparent or translucent section 11 within which is mounted an incandesant lamp 13 which functions as a continuity test light. Probe portion 10 is electrically connected to one terminal of lamp 13 and the ground wire 12 is connected to the other.

When wire 12 is connected to the ground, such as by affixing clip 13 onto the chasis of an automobile, and the tip of probe portion 10 is inserted between the wire harness converter terminals, energization of the lamp 13 will indicate whether the necessary continuity exists. However, because the probe portion 10 is rigid and greatly tapered at the tip, insertion between the terminals at the wrong angle or at too great a depth may cause damage and/or deformation of the terminals. In order to avoid this disadvantageous result, the tip attachment of the present invention, generally designated B, is employed.

The attachment B is preferably formed of a single length of resilient wire, such as replated music wire, preferably of 19 gage (0.042) diameter. Such wire is commercially available. The central portion 16 of the attachment B is a coil spring having approximately 8 to 10 spaced turns and an overall length of slightly less than an inch. The turns may be uniform in diameter, as shown in FIGS. 2 and 3 as central portion 16, or may taper slightly, from an inner diameter 0.018 inch to a diameter of approximately 0.085 inch, as shown in FIG. 4, as central portion 16'.

At one end of the central portion 16 of the attachment (right as seen in the drawings) is a probe engaging portion 18 comprising a coil spring preferably consisting of four coil turns, tightly wound and progressively tapered, from an innter diamter of approximately 0.135 inch to an inner diameter of approximately 0.108 inch. Engaging portion 18 is designed to accept the insertion of the tip of the probe and to frictionally engage same so as to firmly mount the attachment thereon, as seen in FIG. 2.

Extending outwardly from the forward end of central portion 16 is the tip portion 20 of the attachment. The tip portion 20 extends from the central portion 16. Preferably, tip portion 20 extends in a direction generally parallel to the center line of the coil spring sections which make up portions 16 and 18 and hence to the probe when the probe inserted into the attachment. However, tip portion 20 may be bent in various directions depending upon the application. The tip portion 20 has an elongated body 22. Body 22 preferably a substantially uniform cross-sectional dimension and shape through its useful length. Most preferably, body 22 is substantially cylindrical with a uniform diameter and has a rounded forward end, preferably with a spherical radius. However, other constructions such as a retangular cross-section or a non-uniform diamter such as that of a male bannana plug may be used, depending upon the intended application.

Attachment B may be used with a tester A which has an insulated ground wire 12. Because of the smallness and lightness of the attachment, it is preferable to removably affix the attachment B to the ground wire when not in use to prevent loss of the attachment. This may be accomplished with an additional length of the wire 24 which extends radially from the end of the probe engaging portion 18, and is bent to form a recess for frictionally engaging ground wire. A variety of shapes for the ground wire engaging section 24 may be utilized. However, one preferable shape is that of a shepherd's crook, as illustrated in the drawings.

In will not be appreciated that the present invention relates to a tip attachment adapted for use with a tester probe. The attachment is made of a single length of resilient wire, such as music wire, and hence is inexpensive to manufacture. The resiliency of the attachment and the elongation of the tip portion thereof prevent the damaging of terminals if the probe is inserted at the wrong angle or too deeply. The wire forms a resilient central portion, a probe engaging portion and an elongated tip portion. The tip portion preferably extends outwardly from the central portion, in a direction generally parallel to the probe, and has a substantially uniform cross-sectional dimension throughout its useful length. A radially extending wire portion forms a ground wire engaging recess so the attachment can be clipped onto the ground wire to prevent loss.

While the present invention has been described herein as adapted for use with a hand held circuit continuity tester, it should be appreciated that it may be adapted for use with a variety of different types of test devices as well. It can be usefully employed with any type of test device which includes a hand held probe designated to make contact with circuit components.

While only a limited number of preferred embodiments have been disclaimed for purposes of illustration, it is obvious that may variations and modifications can be made thereto. It is intended to cover all these variations and modifications which fall within the scope of the present invention, as defined by the following claims.

I claim:

1. For use with a hand held circuit tester having an ice pick type probe, an attachment adapted for removable mounting on the probe cmprising a coil spring of resilient wire having an axis, said coil spring comprising a portion for fictionally engaging the probe at a location spaced from the end of the probe, a flexible portion extending from said engaging portion towards the end of the probe, and flexible portion comprising spaced turns of wire compressible in the axial direction and an elongated tip portion extending in the axial direction from said resilient portion, beyond the end of the probe.

2. The attachment of claim 1, wherein said tip portion has a substantially uniform cross-section throughout its useful length.

3. The attachment of claim 1, wherein said wire is music wire.

4. The attachment of claim 1, wherein said flexible portion is tapered, being comprised to turns of wire with progressively decreasing diameter.

5. The attachment of claim 1, wherein said tip portion has a round forward end.

6. In combination, a hand held circuit tester having an ice pick type probe and an attachment adapted for removable mounting on the probe, the attachment comprising a coil spring of resilient wire having an axis, said coil spring comprising a part for frictionally engaging said probe at a location spaced from the end of the probe, a flexible portion extending from said engaging portion towards the end of said probe, said flexible portion comprising spaced turns of wire compressible in the axial direction and an elongated tip portion extending in the axial direction from said resilient portion, beyond the end of said probe.

7. The combination of claim 6, wherein said tip portion has a substantially uniform cross-section throughout its useful length.

8. The combination of claim 6, wherein said wire is music wire.

9. The combination of claim 6, wherein said flexibe portion is tapered, being comprised of turns of wire with progressively decreasing diameter.

10. The combination of claim 6, wherein said tip portion has a rounded forward end.

11. An attachment adapted for removable mounting on the probe comprising a coil spring of resilient wire having an axis, said coil spring comprising a portion for fictionally engaging the probe at a location spaced from the end of the probe, a flexible portion extending from said engaging portion towards the end of the probe, said flexible portion comprising spaced turns of wire compressible in the axial direction and an elongated tip portion extending in the axial direction from said resilient portion, beyond the end of the probe, wherein the tester includes a ground wire and further comprising means for removeably affixing the attachment to the ground wire.

12. The attachment of claim 11, wherein said removable affixing means comprising ground wire engaging means.

13. The attachment of claim 12, wherein said ground wire engaging means comprising spring means.

14. The attachment of claim 13, wherein said spring means comprises a resilient wire section bent to form a recess in which a ground wire is frictionally engaged.

15. The attachment of claim 14, wherein said recess is radially spaced from said engaging portion.

16. In combination, a hand held circuit tester having an ice pick type probe and an attachment adapted for removable mounting on the probe, the attachment comprising a coil spring of resilient wire having a axis, said coil spring comprising a part for fictionally engaging said probe at a location spaced from the end of the probe, a flexible portion extending from said engaging portion towards the end of the said probe, said flexible portion comprising spaced turns of wire compressible in the axial direction and an elongated tip portion extending in the axial direction from said resilient portion, beyond the end of said probe, wherein the tester includes a ground wire and further comprising means for removably affixing the attachment to the ground wire.

17. The attachment of claim 16, wherein said removable affixing means comprises ground wire engaging means.

18. The attachment of claim 17, wherein said ground wire engaging means comprises spring means.

19. The attachment of claim 18, wherein said spring means comprises a resilient wire section bent to form a recess in which a ground wire is fictionally engaged.

20. The attachment of claim 19, wherein said recess is radially spaced from said engaging portion.

* * * * *